United States Patent
Zhao et al.

(10) Patent No.: US 11,612,072 B2
(45) Date of Patent: Mar. 21, 2023

(54) POLYHEDRAL LED DISPLAY SCREEN

(71) Applicant: Shenzhen Galaxypixel Electronics Co., Ltd, Shenzhen (CN)

(72) Inventors: Ligang Zhao, Huizhou (CN); Guangming Song, Huizhou (CN); Heng Zhan, Huizhou (CN); Youhe Zhang, Huizhou (CN); Lei Liang, Huizhou (CN)

(73) Assignee: SHENZHEN GALAXYPIXEL ELECTRONICS CO., LTD, Shenzhen (CN)

( * ) Notice: Subject to any disclaimer, the term of this patent is extended or adjusted under 35 U.S.C. 154(b) by 0 days.

(21) Appl. No.: 17/326,761

(22) Filed: May 21, 2021

(65) Prior Publication Data
US 2022/0104374 A1  Mar. 31, 2022

(30) Foreign Application Priority Data
Sep. 30, 2020 (CN) .......................... 202022230296.X

(51) Int. Cl.
*H05K 5/02* (2006.01)
*H05K 5/00* (2006.01)
*H05K 1/02* (2006.01)

(52) U.S. Cl.
CPC .......... *H05K 5/0256* (2013.01); *H05K 1/028* (2013.01); *H05K 5/0017* (2013.01); *H05K 2201/08* (2013.01); *H05K 2201/09009* (2013.01); *H05K 2201/10106* (2013.01); *H05K 2201/10128* (2013.01)

(58) Field of Classification Search
CPC combination set(s) only.
See application file for complete search history.

(56) References Cited

U.S. PATENT DOCUMENTS

| | | | | |
|---|---|---|---|---|
| 2016/0234959 | A1* | 8/2016 | Kuang | G09F 9/3026 |
| 2020/0063767 | A1* | 2/2020 | Jung | H05K 5/03 |
| 2020/0161287 | A1* | 5/2020 | Yoo | G09F 9/301 |
| 2021/0112670 | A1* | 4/2021 | Artsis | G09F 9/33 |
| 2022/0102329 | A1* | 3/2022 | Zhao | H01L 25/0753 |

* cited by examiner

*Primary Examiner* — Hung S. Bui
(74) *Attorney, Agent, or Firm* — WPAT, PC

(57) ABSTRACT

A polyhedral LED display screen is provided and includes multiple cabinet main frames. Each the cabinet main frame is formed with an accommodating cavity. A side of each cabinet main frame is provided with a flexible PCB, an outer side of the flexible PCB facing away from the cabinet main frame is disposed with LED lamp beads, an inner side of the flexible PCB facing towards the cabinet main frame is magnetically connected to the cabinet main frame, and the cabinet main frames are connected to each other to form a regular dodecahedron sphere. The multiple cabinet main frames can be completely covered by the flexible PCBs, a missing display at an end point in the prior art is eliminated, design numbers and complexities of the cabinet main frames and the flexible PCBs are reduced, and an installation of the cabinet main frames becomes more convenient.

6 Claims, 2 Drawing Sheets

POLYHEDRAL LED DISPLAY SCREEN

TECHNICAL FIELD

The disclosure relates to the field of display screens, and particularly to a polyhedral light emitting diode (LED) display screen.

DESCRIPTION OF RELATED ART

At present, an LED DOME, as a new type of spherical display screen, appears in the market. However, for most of the spherical display screens, a sphere is divided into two hemispheres, and then each of the two hemispheres is divided longitudinally according to multiple latitudes. The existing spherical display screens mainly have following disadvantages.

Firstly, since there will be an end point of each of the spherical display screens that cannot be completely covered by LED modules, after a spherical cabinet of the spherical display screen is assembled, in a situation that the whole spherical cabinet is used as a display surface, the end point will affect display effect of the spherical display screen.

Secondly, for the hemisphere after the longitudinal division, a single cabinet can be expanded to be a curved triangle, and shapes of the LED modules are different from each other, therefore, the design cost and the difficulty of later installation are greatly increased, and shape design of the spherical cabinet is also complicated.

SUMMARY

The disclosure aims to provide a polyhedral LED display screen, for solving technical problems such as a poor display effect, a complex structure, a high cost and a great difficulty in later installation of lamps in the prior art.

The disclosure provides a polyhedral LED display screen, including multiple cabinet main frames. Each of the multiple cabinet main frames is formed with an accommodating cavity, a side of each of the multiple cabinet main frames is provided with a flexible printed circuit board (PCB), an outer side of the flexible PCB facing away from the cabinet main frame is disposed with LED lamp beads, an inner side of the flexible PCB facing towards the cabinet main frame is magnetically connected to the cabinet main frame, and the multiple cabinet main frames are connected to each other to form a polyhedron.

In an embodiment, the polyhedral LED display screen further includes a power supply module, arranged in one of the multiple cabinet main frames.

In an embodiment, the multiple cabinet main frames include at least one type of polygonal cabinet main frames.

In an embodiment, each of the multiple cabinet main frames is a regular pentagon in shape.

In an embodiment, an outer sidewall of each of the multiple cabinet main frames is provided with a set of through holes for installing screws.

In an embodiment, a top end surface of the flexible PCB has the same radian as a top end surface of the cabinet main frame.

Compared with the prior art, the polyhedral LED display screen of the disclosure has the following beneficial effects.

Firstly, since the multiple cabinet main frames are connected to each other to form a regular dodecahedron sphere, there is no end point on the regular dodecahedron sphere, similar to a football; further, the polygons forming the regular dodecahedron sphere are the same, such that the multiple cabinet main frames can be completely covered by the flexible PCBs, thereby a missing display at an end point in the prior art is eliminated, design numbers and complexities of the cabinet main frames and the flexible PCBs are reduced, and an installation of the cabinet main frames becomes more convenient.

Secondly, an outer sidewall of each cabinet main frame is provided with a set of through holes for installing screws, and each flexible PCB is magnetically connected to a corresponding cabinet main frame, which can realize the whole quick disassembly and assembly of the multiple cabinet main frames and improve the whole practical performance thereof.

BRIEF DESCRIPTION OF THE DRAWINGS

In order to explain the specific embodiments of the disclosure or the technical solutions in the prior art more clearly, accompanying drawings used in the description of the specific embodiments or the prior art will be briefly introduced hereinafter. It is apparent that the accompanying drawings in the following description are some implementation of the disclosure, and other drawings can be obtained according to these accompanying drawings without creative effort for the ordinary technicians in the field.

REFERENCE NUMERALS

1: Cabinet main frame; 11: Accommodating cavity; 2: Flexible PCB; 3: Set of through holes.

DETAILED DESCRIPTION OF EMBODIMENTS

The technical solutions of the disclosure will be described clearly and completely with reference to the accompanying drawings. It is apparent that the described embodiments are part of the embodiments of the disclosure, but not all of the embodiments of the disclosure.

Components of the embodiments of the disclosure generally described and shown in the accompanying drawings herein can be arranged and designed in various different configurations. Therefore, following detailed description of the embodiments of the disclosure described in conjunction with the accompanying drawings is not intended to limit the scope of the disclosure, but merely represents the selected embodiments of the disclosure.

Based on the embodiments of the disclosure, all other embodiments obtained by the ordinary technicians in the field without creative effort belong to the scope of the disclosure.

In the description of the disclosure, it should be noted that orientations or position relationships indicated by terms "center", "above", "below", "left", "right", "vertical", "horizontal", "inner" and "outer" are based on orientation or position relationships shown in the accompanying drawings, which is merely intended to briefly describe the disclosure and simplifying the description, rather than indicating or implying that corresponding device or element referred to must have a specific orientation and must be constructed and operated in the specific orientation, and thus the orientations or position relationships should not be understood as a limitation of the disclosure. In addition, terms "first", "second", and "third" are merely used for descriptive purposes, and cannot be understood as indicating or implying relative importance.

In the description of the disclosure, it should be noted that unless otherwise specified and limited, terms "installing", "connecting" and "coupling" should be understood in a broad sense, for example, which can be understood as fixed connection, detachable connection or integrated connection; mechanical connection or electrical connection; or direct connection, indirectly connection through an intermediate medium, or internal communication of two elements. For the ordinary technicians in the field, the specific meanings of the above terms in the disclosure can be understood according to specific situations.

Figure 1:
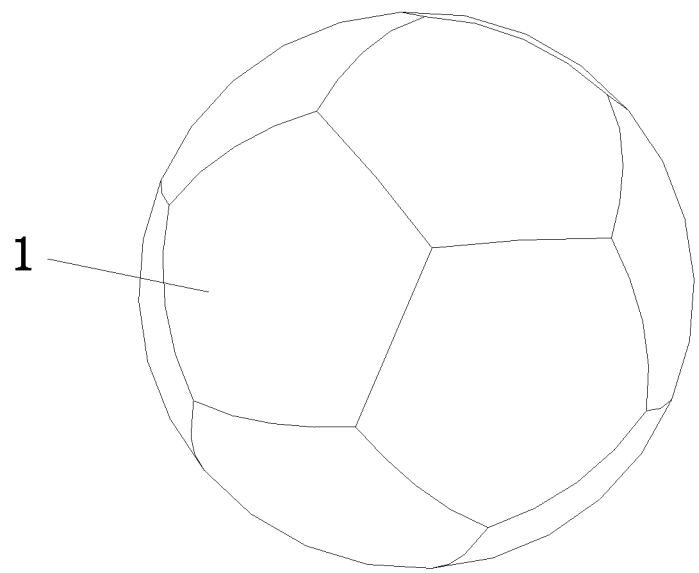
FIG. 1 is a perspective schematic structural view of a polyhedral LED display screen according to an embodiment of the disclosure.
Figure 2:
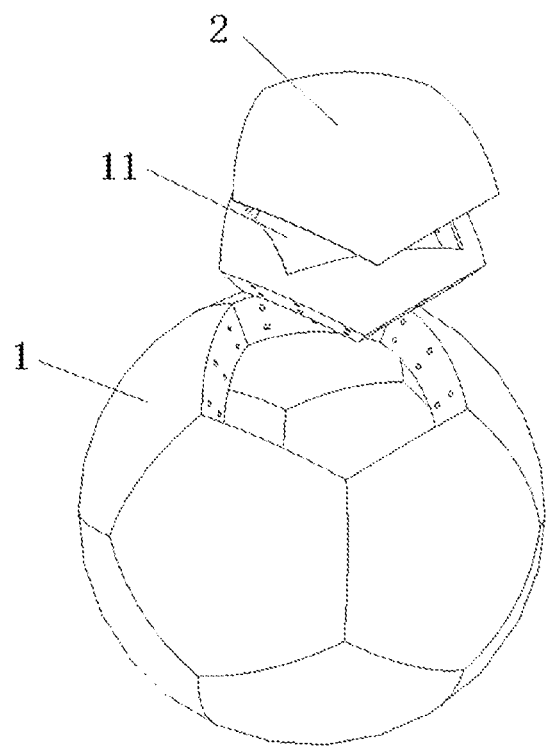
FIG. 2 is a partial perspective exploded view of a polyhedral LED display screen according to an embodiment of the disclosure.
Figure 3:
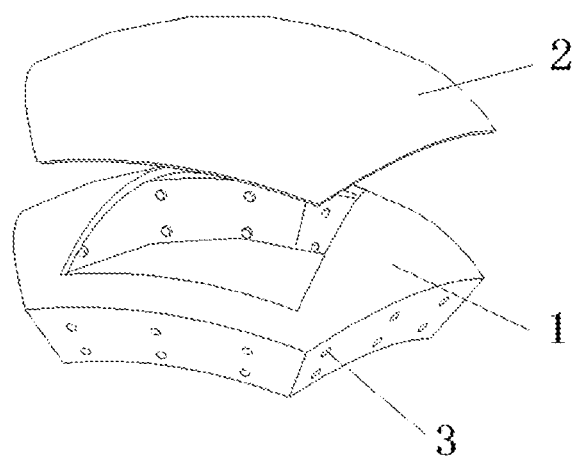
FIG. 3 is a perspective exploded of a flexible PCB and a cabinet main frame according to an embodiment of the disclosure.

With reference to FIGS. 1 to 3, an embodiment of the disclosure provides a polyhedral LED display screen, including multiple (i.e., more than one) cabinet main frames 1. An accommodating cavity 11 is arranged within each of the multiple cabinet main frames 1, and a side of each of the multiple cabinet main frame 1 is provided with a flexible PCB (i.e., a type of PCB) 2. An outer side of the flexible PCB 2 facing away from the cabinet main frame 1 is disposed with LED lamp beads, and an inner side (also referred to as rear side) of the flexible PCB 2 facing towards the cabinet main frame 1 is magnetically connected to (e.g., magnetically absorbed onto) the cabinet main frame 1. The multiple cabinet main frames 1 are connected to each other.

In an embodiment, the polyhedral LED display screen may further include a power supply module, arranged in one of the multiple cabinet main frames 1, and configured to provide power required by the polyhedral LED display screen during operation. For example, the power supply module may be disposed in the accommodating cavity 11 of the one of the multiple cabinet main frames 1.

In an embodiment, the multiple cabinet main frames 1 may include at least one type of polygonal cabinet main frames, which is convenient for integral assembly of the multiple cabinet main frames 1 to form a regular sphere structure.

In an embodiment, each of the multiple cabinet main frames 1 may be a regular pentagon in shape.

In an embodiment, an outer sidewall of each cabinet main frame 1 may be provided with a set of through holes 3 for installing screws, which can realize the whole quick disassembly and assembly of the cabinet main frame 1 and improve the whole practical performance thereof.

In an embodiment, the multiple cabinet main frames 1 may be connected to each other to form a regular dodecahedron sphere structure, in this way, the multiple cabinet main frames 1 can be completely covered by the flexible PCBs 2, thereby a missing display at an end point in the prior art is eliminated, design numbers and complexities of the cabinet main frames 1 and the flexible PCB 2 are reduced, and an installation of the cabinet main frames 1 becomes more convenient.

In an embodiment, a top end surface of the flexible PCB 2 may have the same radian as a top end surface of the cabinet main frame 1, which improves a coverage of LED lamp beads. In other words, the top end surface of the flexible PCB 2 and the top end surface of the cabinet main frame 1 both may be curved surfaces.

With respect to the polyhedral LED display screen of the disclosure, since the multiple cabinet main frames 1 are connected to each other to exemplarily form a regular dodecahedron sphere, there is no end point on the regular dodecahedron sphere, similar to a football; further, the polygons forming the regular dodecahedron sphere are the same, such that the multiple cabinet main frames 1 can be completely covered by the flexible PCBs 2, thereby a missing display at an end point in the prior art is eliminated, design numbers and complexities of the cabinet main frames 1 and the flexible PCBs 2 are reduced, and an installation of the cabinet main frames 1 becomes more convenient. Moreover, the outer sidewall of each cabinet main frame 1 is provided with the set of through holes 3 for installing screws, and each flexible PCB 2 is magnetically connected to a corresponding cabinet main frame 1, which can realize the whole quick disassembly and assembly of the multiple cabinet main frames 1 and improve the whole practical performance thereof.

Finally, it should be noted that the above embodiments are merely used to illustrate the technical solutions of the disclosure, but not to limit the technical solutions. Although the disclosure has been described in detail with reference to the aforementioned embodiments, those of ordinary skill in the art should understand that the technical solutions described in the aforementioned embodiments can be also modified, or some or all of the technical features of the embodiments can be equivalently replaced, and the spirits of corresponding technical solutions with these modifications or replacements do not deviate from the scope of the technical solutions of each of the embodiments of the disclosure.

What is claimed is:

1. A polyhedral light emitting diode (LED) display screen, comprising a plurality of cabinet main frames (1), wherein each of the plurality of cabinet main frames (1) is formed with an accommodating cavity (11), a side of each of the plurality of cabinet main frames (1) is provided with a flexible printed circuit board (PCB) (2), an outer side of the flexible PCB (2) facing away from the cabinet main frame (1) is disposed with LED lamp beads, an inner side of the flexible PCB (2) facing towards the cabinet main frame (1) is magnetically connected to the cabinet main frame (1), and the plurality of cabinet main frames (1) are connected to each other to form a polyhedron;
wherein the plurality of cabinet main frames (1) are connected to each other to form a regular dodecahedron sphere structure, and a surface of each of the plurality of cabinet main frames (1) facing away from a center of the regular dodecahedron sphere structure is a regular pentagon in shape.

2. The polyhedral LED display screen according to claim 1, further comprising a power supply module arranged in one of the plurality of cabinet main frames (1).

3. The polyhedral LED display screen according to claim 1, wherein an outer sidewall of each of the plurality of cabinet main frames (1) is provided with a set of through holes (3) for installing screws.

4. The polyhedral LED display screen according to claim 1, wherein a top end surface of the flexible PCB (2) has the same radian as a top end surface of the cabinet main frame (1).

5. The polyhedral LED display screen according to claim 1, wherein the surface of each of the plurality of cabinet main frames (1) facing away from the center of the regular dodecahedron sphere structure is surrounded by five equal edges.

6. The polyhedral LED display screen according to claim 1, wherein each of the plurality of cabinet main frames (1)

comprises five side surfaces, each of the five side surfaces are adjoined to two of the five side surfaces to define the regular pentagon, and each of the plurality of cabinet main frames (1) is directly in contact with five cabinet main frames of the plurality of cabinet main frames (1) through the five side surfaces respectively.

\* \* \* \* \*